(12) United States Patent
Kowalski et al.

(10) Patent No.: US 8,806,288 B2
(45) Date of Patent: Aug. 12, 2014

(54) SYSTEMS AND METHODS FOR PROVIDING UNEQUAL ERROR PROTECTION CODE DESIGN FROM PROBABILISTICALLY FIXED COMPOSITION CODES

(75) Inventors: John Michael Kowalski, Camas, WA (US); Sayantan Choudhury, Vancouver, WA (US); Kimihiko Imamura, Vancouver, WA (US); Lizhong Zheng, Canton, MA (US); Ahmad Khoshnevis, Portland, OR (US); Zhanping Yin, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 797 days.

(21) Appl. No.: 12/404,264

(22) Filed: Mar. 13, 2009

(65) Prior Publication Data

US 2010/0235709 A1 Sep. 16, 2010

(51) Int. Cl.
*H03M 13/00* (2006.01)

(52) U.S. Cl.
USPC .......................................... 714/752

(58) Field of Classification Search
USPC .......................................... 714/752, E11.032
See application file for complete search history.

(56) References Cited

U.S. PATENT DOCUMENTS

| | | | |
|---|---|---|---|
| 6,348,880 B1 * | 2/2002 | Xu | 341/50 |
| 6,665,831 B1 * | 12/2003 | Yoshida et al. | 714/774 |
| 6,854,082 B1 * | 2/2005 | Rhee | 714/755 |
| 7,477,622 B2 * | 1/2009 | Attar et al. | 370/329 |
| 7,856,584 B2 * | 12/2010 | Ovchinnikov et al. | 714/752 |
| 2003/0023647 A1 * | 1/2003 | Epstein | 708/250 |
| 2003/0126545 A1 * | 7/2003 | Tan | 714/786 |
| 2003/0192004 A1 * | 10/2003 | Gopalakrishnan | 714/758 |
| 2004/0100995 A1 * | 5/2004 | Xu | 370/511 |
| 2007/0183384 A1 * | 8/2007 | Kwak et al. | 370/338 |
| 2008/0232340 A1 | 9/2008 | Wan et al. | |
| 2008/0250294 A1 * | 10/2008 | Ngo et al. | 714/752 |
| 2008/0294967 A1 * | 11/2008 | Tomlinson et al. | 714/800 |
| 2009/0180495 A1 | 7/2009 | Li et al. | |
| 2010/0150252 A1 * | 6/2010 | Camp et al. | 375/240.27 |

(Continued)

FOREIGN PATENT DOCUMENTS

| | | |
|---|---|---|
| CN | 101133558 | 2/2008 |
| CN | 101300768 | 11/2008 |

(Continued)

OTHER PUBLICATIONS

Sharp, "Embedded Coding for PUCCH Transmissions of CQI+ACK/NACK," R1-080107, Jan. 2008.

(Continued)

*Primary Examiner* — Ajay Bhatia
*Assistant Examiner* — Thien D Nguyen
(74) *Attorney, Agent, or Firm* — Austin Rapp & Hardman

(57) ABSTRACT

A method of encoding that uses standard codecs such as linear encoders and decoders for encoding and decoding data with different levels of robustness to errors is described. In one configuration, multiple encoders may be utilized, and one of the encoders may use a standard encoder such as a turbo code followed by a nonlinearity that creates an unequal distribution of ones and zeros in a binary representation of the code. In another configuration, a coder may be utilized that represents message outputs as "channels" that create state transitions (or symbol errors) in a data forward error correction coder.

31 Claims, 9 Drawing Sheets

(56) References Cited

U.S. PATENT DOCUMENTS

| | | | |
|---|---|---|---|
| 2010/0162078 A1* | 6/2010 | Miller et al. | 714/755 |
| 2010/0235709 A1* | 9/2010 | Kowalski et al. | 714/752 |
| 2012/0011418 A1* | 1/2012 | Gaur | 714/776 |

FOREIGN PATENT DOCUMENTS

| | | |
|---|---|---|
| EP | 1 357 691 | 3/2003 |
| JP | 2001-119558 | 4/2001 |
| JP | 2001-507893 | 6/2001 |
| JP | 2003-333017 | 11/2003 |
| WO | 99/35779 | 7/1999 |

OTHER PUBLICATIONS

Sharp, "Embedded Coding for PUCCH Transmissions of CQI+ACK/NACK," R1-080509, Jan. 2008.

Bernard, A. et al., "Embedded Joint Source-Channel Coding of Speech using Symbol Puncturing of Trellis Codes," IEEE International Conference on Acoustics, Speech, and Signal Processing, pp. 2427-2430, vol. 5, 1999.

International Search Report issued for International Patent Application No. PCT/JP2010/052569 on May 25, 2010.

Office Action issued for Japanese Patent Application No. JP 2011-538193 on Apr. 9, 2013.

Office Action issued for Chinese Patent Application No. CN 201080011274.0 on Sep. 24, 2013.

* cited by examiner

SYSTEMS AND METHODS FOR PROVIDING UNEQUAL ERROR PROTECTION CODE DESIGN FROM PROBABILISTICALLY FIXED COMPOSITION CODES

TECHNICAL FIELD

The present invention relates generally to wireless communications wireless communications-related technology. More specifically, the present invention relates to systems and methods for providing unequal error protection code design from probabilistically fixed composition codes.

BACKGROUND

Channel coding, also known as forward error correction (FEC), is a system of error control for data transmission whereby a sender may add redundant data to a transmitted message. This may allow a receiver of the message to detect and correct errors in the message under some circumstances and within some boundaries. FEC may be accomplished by adding redundant data to the transmitted information using a predetermined algorithm. Traditionally, the emphasis in this type of coding has been the design of channel capacity approaching codes, e.g., turbo codes and low-density parity-check (LDPC) codes. Therefore, the main question addressed by most researchers has been how to design codes that achieve a particular point on the rate-distortion curve for one type of message.

Embedded coding, as used herein, may refer to a system of error control for data transmission, whereby the sender adds redundant data to multiple simultaneously transmitted messages. Thus, embedded coding may be channel coding for multiple types of messages. The term "embed" comes from the fact that one or more types of information may be hidden in the codeword of another message. The terms "message" and "information" may be used interchangeably.

Embedded coding, as described herein, solves a different problem than traditional channel coding. Specifically, the problem addressed is the situation where multiple levels of reliabilities (in terms of error probability) are sought for different types of information/messages. In other words, one advantage of embedded coding is the ability to support a variety of applications with different quality-of-service (QoS) requirements. Therefore, providing unequal error protection (UEP) is one of the functions of embedded coding. Benefits may be realized by improved systems and methods related to unequal error protection code design.

DETAILED DESCRIPTION

Figure 1:
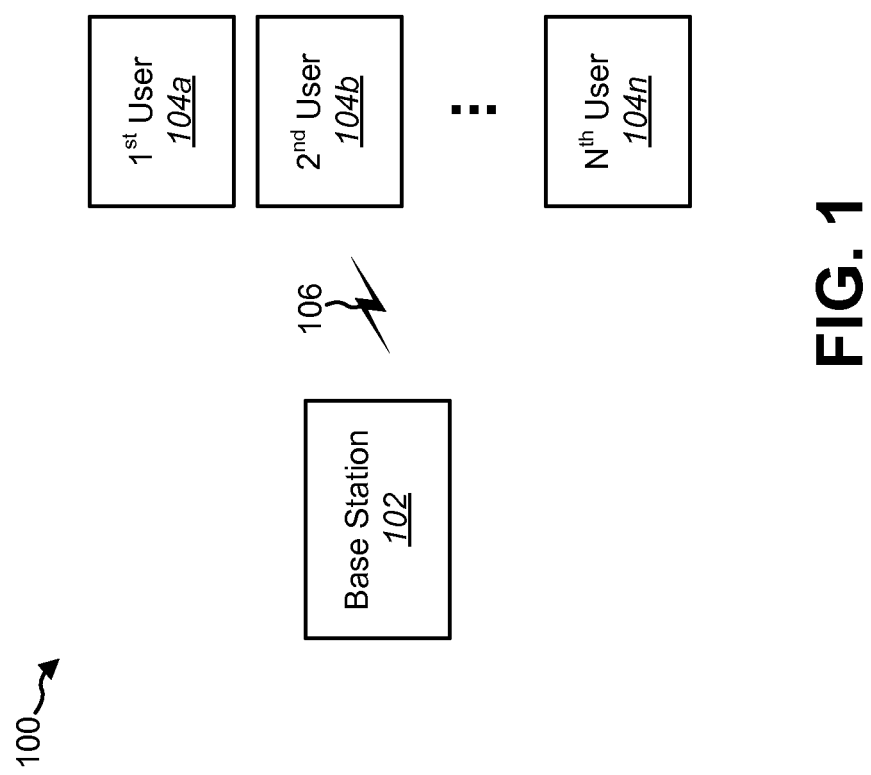
FIG. 1 is a block diagram illustrating a wireless communication system in which the methods disclosed herein may be practiced.

A method for embedded unequal error protection encoding is disclosed. First data and second data are encoded. Linear encoders are used to encode the first data and to encode the second data. The first data and the second data are encoded so as to provide different levels of robustness to errors. A signal that comprises the encoded first data and the encoded second data is sent over a channel to a receiver.

A code that is used to encode the first data may include a standard code followed by a nonlinearity that creates an unequal distribution of ones and zeros in a binary representation of the code. The standard code may be selected from the group consisting of a turbo code, a low density parity check (LDPC) code, a Reed-Solomon code, and a convolutional code.

A code that is used to encode the first data may include a standard code in which a fraction of the coded data may be followed by a nonlinearity that creates an unequal distribution of ones and zeros in a binary representation of the code. The standard code may be selected from the group consisting of a turbo code, a low density parity check (LDPC) code, a Reed-Solomon code, and a convolutional code.

A code that is used to encode the first data may include a standard code followed by a code whose set of codewords does not contain any codewords' complements. The standard code may be selected from the group consisting of a turbo code, a low density parity check (LDPC) code, a Reed-Solomon code, and a convolutional code.

The nonlinearity may be created by an approximation to an inverse distribution function. The nonlinearity may be successively applied to subsequences of codewords from the original code. Codewords in the nonlinearity may be chosen to be unequal and may also be chosen to maximize a measure of Hamming distance between the codewords.

The second data may be control data for forward error correction. A probabilistic process may be used to encode the control data.

Encoding the second data may include representing message outputs as channels that create state transitions or symbol errors in a data forward error correction coder. Encoding the second data may include mapping a sequence of previously coded data into a chosen empirical distribution based on a desired stochastic matrix.

The first data may include user data. The second data may include messages. Coded messages may be mapped into a coded sequence of user data in such a way as to maintain error-free decoding of the encoding of data subject to maintaining a given empirical distribution representing forward error correction encoded messages. Alternatively, coded messages may be mapped into a coded sequence of user data in such a way as to maintain error-free decoding of the encoding of data subject to maintaining a minimum Hamming weight between the coded user data and the message-embedded coded data.

The messages to be encoded may be channel quality indicator (CQI) values. The user data may be uplink shared data in a 3GPP Long Term Evolution (LTE) system or a 3GPP LTE-like system.

The second data may be heavily protected data. The first data may be less heavily protected data. Inputs for both the heavily protected data and the less heavily protected data may include downlink control information.

A method for embedded unequal error protection decoding is disclosed. A signal is received that includes encoded first data and encoded second data. The first data and the second data are encoded so as to provide different levels of robustness to errors. The first data and the second data are decoded. Linear decoders are used to decode the first data and to decode the second data.

A wireless communication device that is configured to implement embedded unequal error protection encoding is disclosed. The wireless communication device includes a processor, memory in electronic communication with the processor, and instructions stored in the memory. The instructions are executable by the processor to encode first data and to encode second data. Linear encoders are used to encode the first data and to encode the second data. The first data and the second data are encoded so as to provide different levels of robustness to errors. The instructions are also executable to send a signal that includes the encoded first data and the encoded second data over a channel to a receiver.

A wireless communication device that is configured to implement embedded unequal error protection decoding is disclosed. The wireless communication device includes a processor, memory in electronic communication with the processor, and instructions stored in the memory. The instructions are executable by the processor to receive a signal that includes encoded first data and encoded second data. The first data and the second data are encoded so as to provide different levels of robustness to errors. The instructions are also executable to decode the first data and to decode the second data. Linear decoders are used to decode the first data and to decode the second data.

The systems and methods disclosed herein relate to the problem of efficiently using a channel to transmit data with varying reliability using the same time/frequency resources, using codes originally developed for the transmission of information over channels with uncorrelated noise from data symbol to data symbol. The preponderance of current practice is to use orthogonal partitions of time and frequency instead of using the same time and frequency for the control messages and user data. However, it is known that forms of the Shannon coding theorems exist that demonstrate that it is more efficient to use the same time/frequency resources for coding arbitrarily long sequences. Therefore, a UEP coding and decoding system may provide greater information reliability and/or greater capacity compared to orthogonalized, separate transmission of information.

FIG. 1 is a block diagram illustrating a wireless communication system 100 in which the methods disclosed herein may be practiced. A base station 102 may be in wireless communication with a plurality of user devices 104 (which may also be referred to as user equipment, mobile stations, subscriber units, access terminals, etc.). A first user device 104a, a second user device 104b, and an Nth user device 104n are shown in FIG. 1. The base station 102 may transmit data to the user devices 104 and receive data from the user devices 104 over a radio frequency (RF) communication channel 106.

As used herein, the term "transmitter" refers to any component or device that transmits signals. A transmitter may be implemented in a base station 102 that transmits signals to one or more user devices 104. Alternatively, or in addition, a transmitter may be implemented in a user device 104 that transmits signals to one or more base stations 102.

The term "receiver" refers to any component or device that receives signals. A receiver may be implemented in a user device 104 that receives signals from one or more base stations 102. Alternatively, or in addition, a receiver may be implemented in a base station 102 that receives signals from one or more user devices 104.

The communications system 100 may be a $3^{rd}$ Generation Partnership Project (3GPP) Long Term Evolution (LTE) system or 3GPP LTE-like system (e.g., 3GPP LTE-Advanced). 3GPP is a collaboration of standards organizations throughout the world. The goal of 3GPP is to make a globally applicable third generation (3G) mobile phone system specification within the scope of the IMT-2000 (International Mobile Telecommunications-2000) standard as defined by the International Telecommunication Union. 3GPP LTE (Long Term Evolution) is the name given to a project within 3GPP to improve the Universal Mobile Telecommunications System (UMTS) mobile phone standard to cope with future technology evolutions. 3GPP LTE Advanced is currently being standardized by 3GPP as an enhancement of 3GPP LTE.

Figure 2:
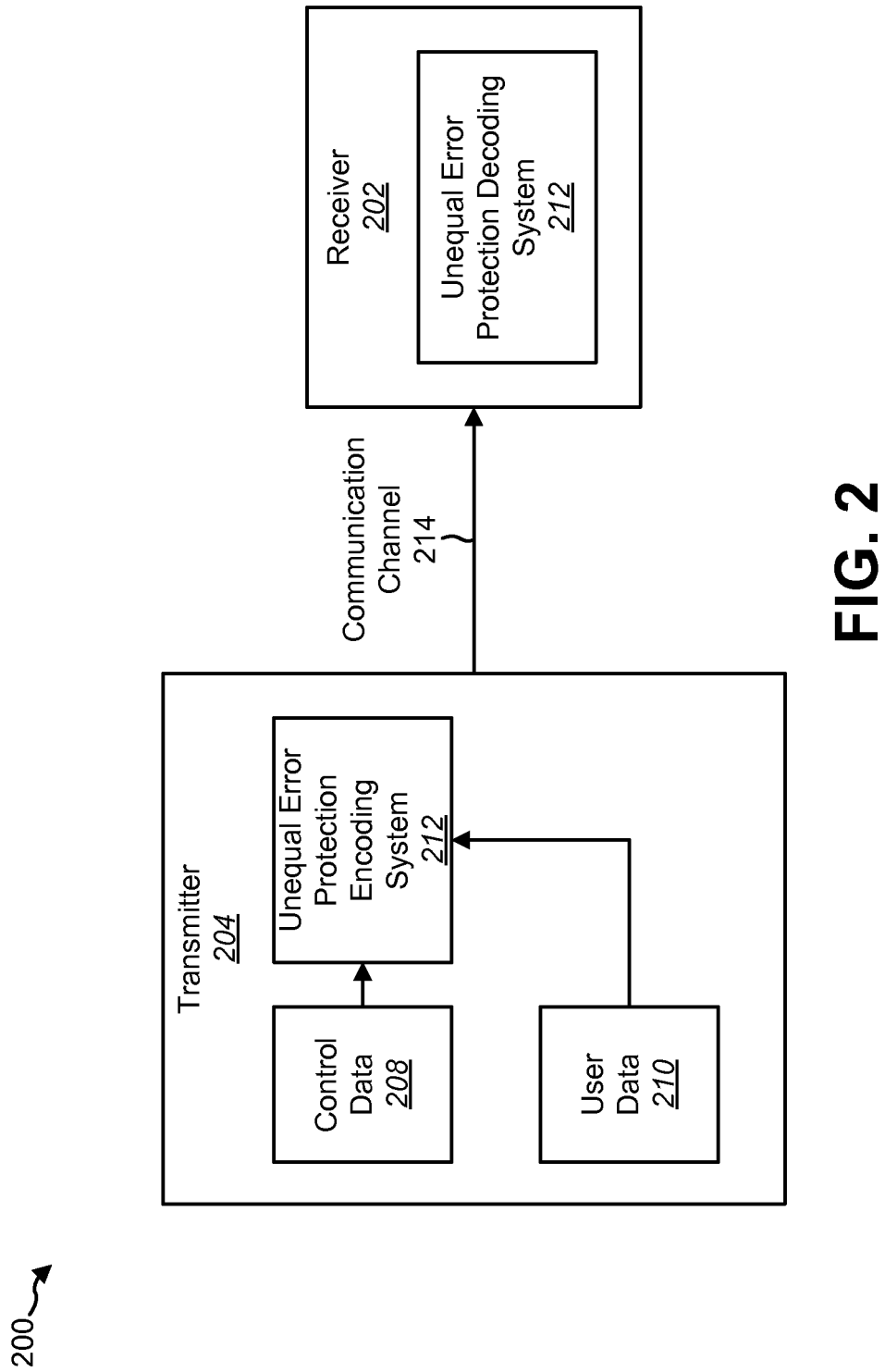
FIG. 2 is a block diagram illustrating a communication channel that may exist between a transmitter and a receiver in a wireless communication system.

FIG. 2 is a block diagram illustrating a communication channel that may exist between a transmitter 204 and a receiver 202 in a wireless communication system 200. As shown, communication from the transmitter 204 to the receiver 202 may occur over a communication channel 214. Where the transmitter 204 is implemented in a base station 102 and the receiver 202 is implemented in a user device 104, the communication channel 214 may be referred to as the downlink, forward link, etc. Where the transmitter 204 is implemented in a user device 104 and the receiver 202 is implemented in a base station 102, the communication channel 214 may be referred to as the uplink, reverse link, etc.

Forward error correction (FEC) for both control data 208 and user data 210 may be achieved in the same time/frequency resources by modeling the encoding process of the control data 208 as encoding one of a discrete set of messages. Thus, the control data 208 may be modeled as a message set v with one or more discrete messages. Each message may be isomorphic to a stochastic matrix which governs how an FEC-encoded sequence of the user data 210 is modified. This modification may be either deterministic or (pseudo-)random. User data 210 may be uplink shared data in a 3GPP LTE system or a 3GPP LTE-like system.

Control data 208 and user data 210 may be encoded using a UEP encoding system 212 at the transmitter 204. The UEP encoding system 212 may use standard codecs such as linear encoders for encoding data with different levels of robustness to errors. The encoded data may then be transmitted over a communication channel 214 to a receiver 202. An unequal error protection decoding system 212 may decode the received encoded data. The unequal error protection decoding system 212 may decode the received encoded data using standard codecs such as linear decoders for decoding data with different levels of robustness to errors.

Figure 3:
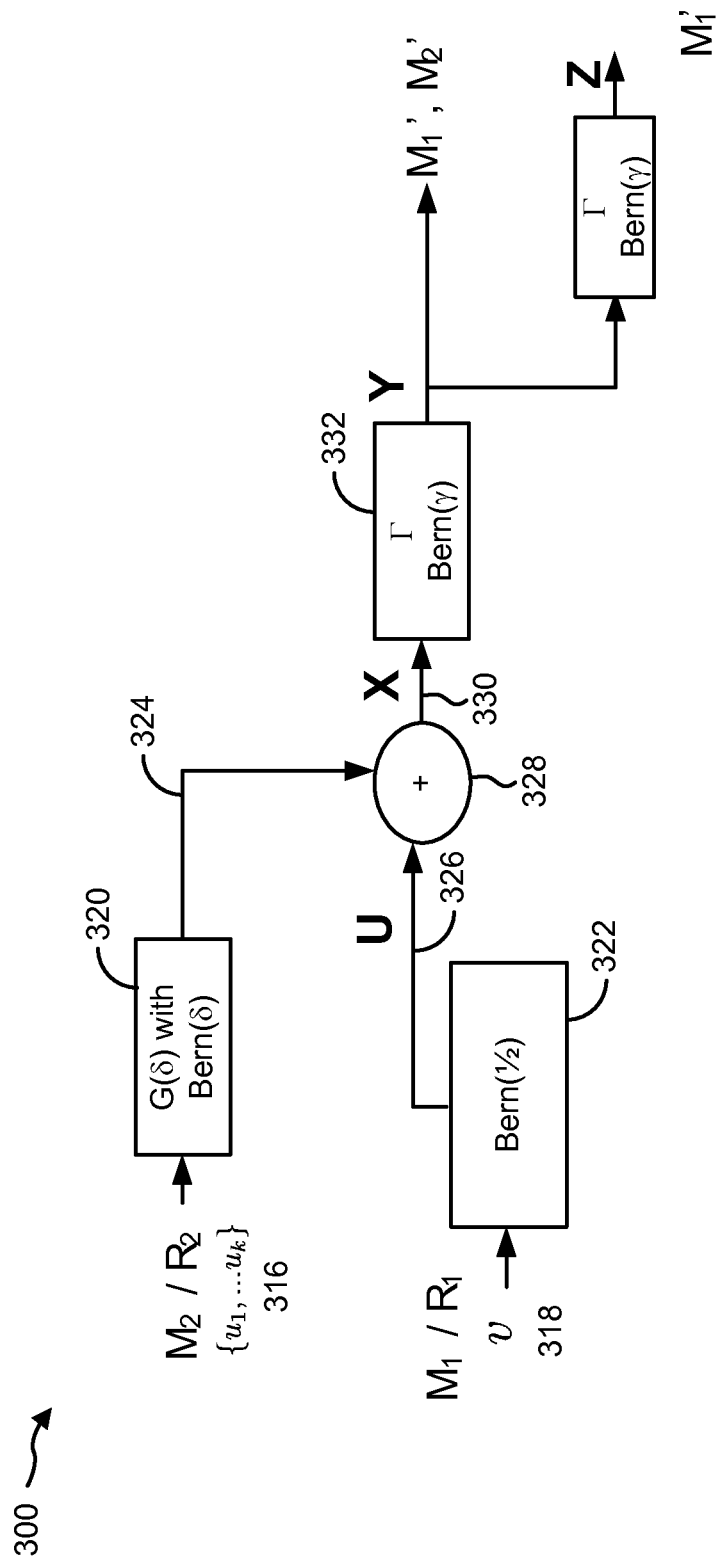
FIG. 3 is a block diagram illustrating an unequal error protection (UEP) system that may be used in the present systems and methods.

FIG. 3 is a block diagram illustrating an unequal error protection (UEP) system 300 that may be used in the present systems and methods. Suppose that over a channel F, we wish to send a sequence of symbols $\{u_1, \ldots u_k\}$ 316 contemporaneously with a message v 318 (taken from a fixed set of K possible messages). These symbols $\{u_1, \ldots u_k\}$ may themselves represent coded outputs from a channel coder; for example they may be the outputs of a turbo-coder, an LDPC coder, or a convolutional encoder. As such these symbols, if represented as binary symbols, may themselves be distributed or approximately distributed as independent, identically distributed binary symbols with the probability of a 1 or 0 being ½. We wish the probability that v 318 is received in error to be relatively small compared to the error rate of the sequence of symbols 316. FIG. 3 represents the case where the message set v={a, b} is binary valued. Thus, K=2. In addition, the set of symbols {$u_1, \ldots u_k$} 316 consists of a sequence of k bits. The message set v may represent control information or control data 208. For example, the message set v may be CQI values. The set of symbols {$u_1, \ldots u_k$} 316 may represent user data 210.

The sequence of bits may be encoded with a Bern($\delta$) code. A Bern($\delta$) encoder 320 is shown in FIG. 3. The term "Bern ($\delta$)" refers to a binary code whose codeword symbols (i.e., the bits in the codeword) are, among other properties, distributed or approximately distributed as in a Bernoulli distribution with probability $\delta$; that is (without loss of generality) the probability that the r-th symbol in a codeword is 0 is $\delta$, and the probability that it is 1 is 1–$\delta$. This scheme may be generalized to codes in which it is specified that a particular fixed composition is used. For example, every single codeword may have a particular distribution or all codewords may have numbers for each symbol, as has been the case for previous reports on unequal error protection coding.

The message v 318 is encoded using a Bern(½) code. A Bern(½) encoder 322 is shown in FIG. 3. The rate of the first 1 bit message encoder 322 is 1/n, and the encoder 320 for the sequence of symbols {$u_1, \ldots u_k$} code has rate k/n.

The encoded user data 324 and the encoded control data 326 may be added together with a bit-wise exclusive OR function 328 (Modulo 2 addition). The combined encoded signals 330 may then be sent over a channel $\Gamma$ 332. The channel $\Gamma$ 332 may be modeled as a Bern($\gamma$) channel.

A Bern($\gamma$) channel is a channel akin to the Bern($\delta$) code: it is a memoryless binary symmetric channel that flips bits with probability $\gamma$, and leaves bits unflipped with probability 1–$\gamma$, so that for constant inputs (all ones or all zeros) the output is a sequence of Bernoulli random variables. These channel models, such as the sources, are used for illustrative purposes, and to motivate the actual design of the unequal error protection system. The UEP system itself is not dependent on the real existence of such channels. Alternatively, the channel may be an additive White Gaussian Noise Channel.

If the channel $\Gamma$ 332 is relatively benign, i.e., $\gamma$ is relatively small, both the data and messages will be received without error; when the channel makes a moderate number of errors, however, we wish the messages v to be received with higher probability than the data symbols {$u_1, \ldots u_k$}.

Figure 4:
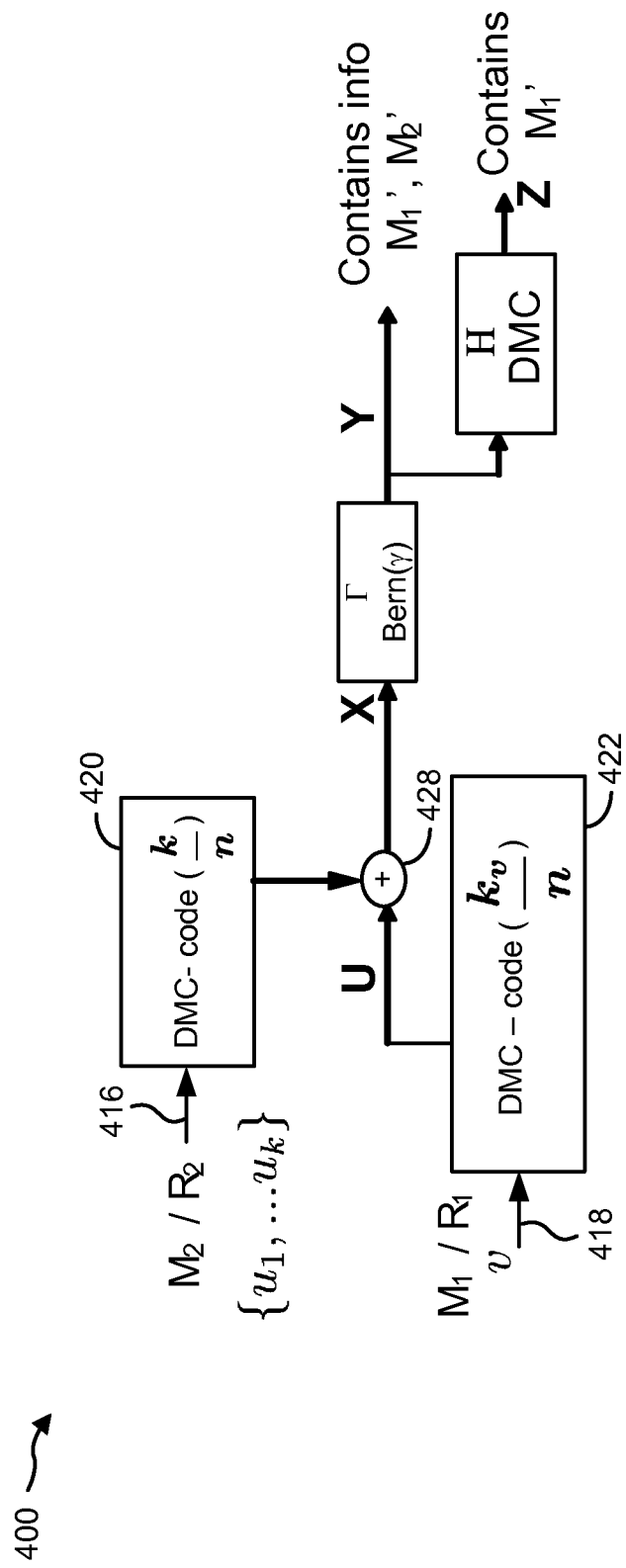
FIG. 4 is a block diagram illustrating a UEP encoding system and a channel for a case of symbol alphabets that have more than two symbols.
Figure 5:
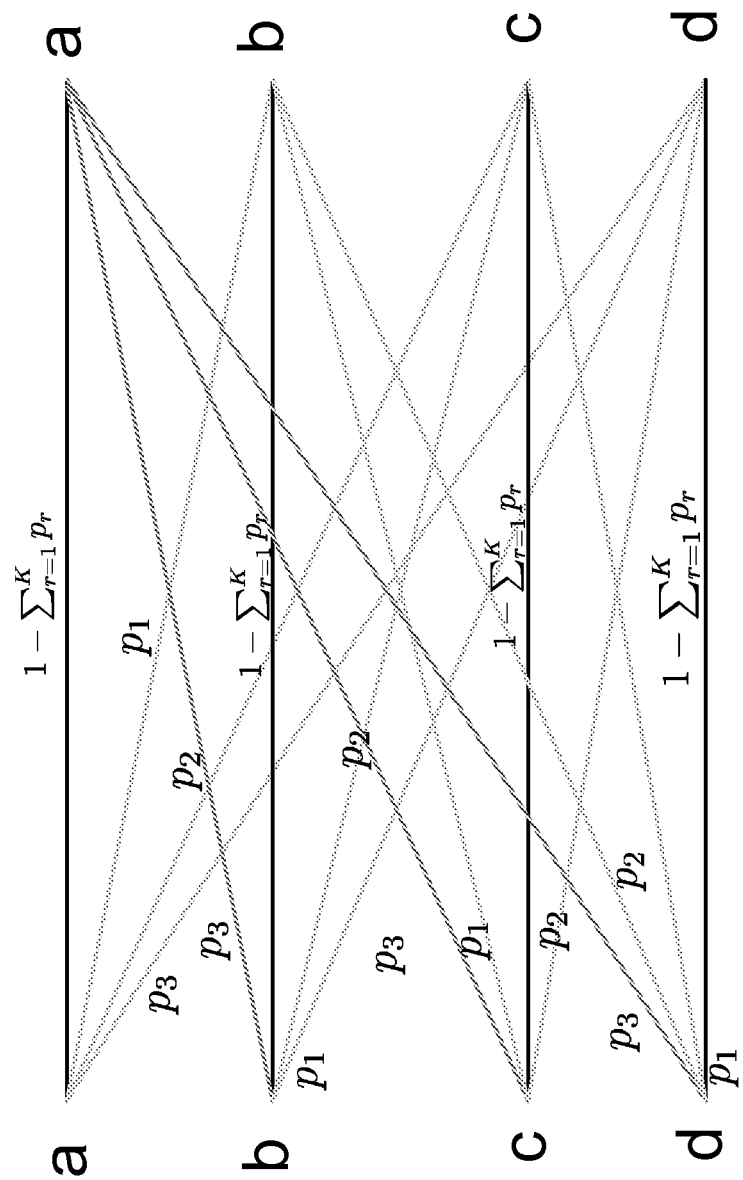
FIG. 5 illustrates an example of a K-ary discrete memoryless channel where K=4.

FIG. 4 is a block diagram illustrating a UEP encoding system 400 for a case of symbol alphabets that have more than two symbols. A set of messages v 418 in which high protection is required is input into an encoder 422 whose output codewords are distributed as though they were symbols from a discrete memoryless channel (DMC) (such as shown in FIG. 5) with rate $$\frac{k_v}{n}.$$

In addition, data 416 is encoded with a similar DMC-like encoder 420 with rate k/n. In particular, these DMC encoders 420, 422 may be modeled as K-ary symmetric channels (as in FIG. 5). In this case the Modulo-2 adder 328 (from FIG. 3) may be replaced with a Modulo-K adder 428. An example of a K-ary discrete memoryless channel where K=4 is shown in FIG. 5.

One possible design of a coder that creates an unequal distribution of bit values will now be described. Consider a sequence of bits {$b_1, b_2, \ldots b_n$}=b whose elements are independently and identically distributed as Bernoulli with $p[b_k=0]=p[b_k=1]=\frac{1}{2}$. We will refer to such sequences as "Bernouli(½)" sequences. We consider the situation where there are precisely $2^k$ possible sequences (hence vectors in b) out of $2^n$. Thus the image of b "samples" GF($2^n$); it is an "into" mapping but not an "onto" mapping.

We seek a function y=f(b) such that:

I. y is a binary sequence of length m≥n whose elements are at least approximately independently and identically distributed as Bernoulli with $p[b_k=1]=\delta$ and $p[b_k=1]=1-\delta$. We will refer to such sequences as "Bernouli($\delta$)" sequences.

II. $g=f^{-1}(y)$ exists and is readily computable. Furthermore, $\forall$ b $\in$ GF($2^n$), b=$f^{-1}$(f(b)), that is, the inverse function is unique.

III. $g=f^{-1}(y)$ can be implemented deterministically, preferably; i.e., the functional form of $f^{-1}$ itself does not depend on b.

Some properties of this function and issues related to solution of this problem are as follows.

For any given b, the weight spectrum may be denoted as in Equation 1:

$$w(b) = \sum_{i=1}^{n} I[b_i = 1] = \sum_{i=1}^{n} b_i \qquad (1)$$

where I[ ] denotes the indicator function. From the above, w(b) is binomially distributed. As n becomes large, the De Moivre-Laplace theorem may be invoked and thus both w(b) and w(y) are asymptotically normal. Furthermore, as shown in Equation 2 and Equation 3:

$$E[w(b)] = \frac{n}{2} \qquad (2)$$

$$E[w(y)] = m\delta \qquad (3)$$

Because of II (above), not all values of m, n, and $\delta$ will yield a useful result. For example, as a trivial case, consider m=n=4, k=2, and $\delta$=0.01. Then, it is impossible to model a sequence in such a way that could "sample" $\delta$=0.01. In general, for any codeword, Equation 4 applies:

$$p[k \text{ ones in } b] = \binom{n}{k}\left(\frac{1}{2}\right)^k\left(1-\left(\frac{1}{2}\right)\right)^{n-k} \qquad (4)$$

and it is desired that:

$$p[k \text{ ones in } y] = \binom{m}{k}(\delta)^k(1-(\delta))^{m-k} \qquad (5)$$

and the variance of this would be m$\delta$(1–$\delta$). In general, m should be large enough so that there is a one to one mapping between b and f(b).

The function b may be an abstraction or approximation of what can be observed as outputs from codes such as turbo-codes, low-density parity-check (LDPC) codes and other "near Shannon limit" codes.

To determine a solution to the above problem, consider the mapping in Equation 6:

$$b = \{b_1, b_2, \ldots b_n\} \longleftrightarrow \sum_{r=1}^{n} b_r 2^{-r} = v \qquad (6)$$

If b is distributed with $p[b_k=0]=p[b_k=1]=\frac{1}{2}$, then v is distributed uniformly from 0.0000 to 0.111 ... $1_2$, where the upper limit is reached when all n bits are ones. If instead the $p[b_k=1]=\delta$ and $p[b_k=1]=1-\delta$, there would be cumulative distributive functions (CDFs).

To generate the Bernoulli($\delta$) codewords, then what can be done is to:

First, generate the n bit Bernoulli($\frac{1}{2}$) codewords with $$p[b_k = 0] = p[b_k = 1] = \frac{1}{2}.$$

Second, perform the mapping $$b = \{b_1, b_2, \ldots b_n\} \longleftrightarrow \sum_{r=1}^{n} b_r 2^{-r} = v.$$

Third, start with some m>n. The words v are generated from the words b by padding zeros onto the binary expansion of b (i.e., v above.) For the distribution $F_\zeta$ determined by Bernoulli($\delta$) codewords v of length m where:

$$v = \{v_1, v_2, \ldots v_m\} \longleftrightarrow \sum_{r=1}^{m} v_r 2^{-r} = \zeta \qquad (7)$$

form $F\zeta^{-1}$. As $F\zeta$ is a relation between two sequences, $F\zeta^{-1}$ is simply the inverse of that relation. $F\zeta$ may be computed by recursion:

$$P\left\{\zeta \leq \sum_{r=1}^{m} v_r 2^{-r}\right\} = P\{2^m \zeta \leq I\} \text{ for some } 0 \leq I \leq 2^m - 1. \qquad (8)$$

$$= P\{2^m \zeta \leq I - 1\} + P\{2^m \zeta = I\} \text{ for } I > 0 \text{ and} \qquad (9)$$

$$= (1 - (\delta))^m \qquad \text{for } I = 0. \qquad (10)$$

Fourth, if m does not result in a 1:1 mapping for all of the original $2^n$ codewords, increase m and return to the third step above. Otherwise, the process terminates.

Alternatively, one may generate a 1:1 mapping from the $2^m$ codewords by taking pseudo-randomly generated subsets of $2^n$ codewords until a 1:1 mapping is achieved. In like manner random subsets of $2^n$ codewords may be selected to have some property such as maximized minimum Hamming distance between codewords.

As the number of bits increases in the binomially distributed sequence with $p\{b_k=1\}=\zeta$, a convergence of the sequence CDFs may be observed. For any finite number of bits, however, the "actual $\delta$," i.e. the relative frequency of ones in codewords differs from the "design" delta, although this difference appears to disappear (as it should) as the number of bits increases. At 18 bits, for example, the relative frequency in (possibly repeated) codewords is more than 98.6% of the "design" $\delta$ of 0.625. As noted previously, there will, for the number of bits in equal to the same number of bits out, be either a linear curve (hence no effect from coding) or repeated entries in the codeword; and that this phenomenon may be remedied by increasing the number of bits. An alternative scheme would be to revise a nonlinearity which is not one to one by replacing redundant entries with nonredundant entries, and revise the nonlinearity.

The foregoing has not considered that the nonlinearity being constructed is actually a rate n/m code, and as such should provide some level of increased resiliency to channel errors.

One alternative way to implement this technique that would include additional robustness to channel errors would be to select a code whose distribution of codewords is drawn from an m bit representation of $F_\zeta^{-1}$, and whose codewords approximate a Bernoulli($\delta$) distribution, but whose codewords are chosen to maximize Hamming distance between codewords as well. This can be done by choosing multiple sets of $2^n$ codewords pseudo-randomly according to a uniform distribution from the $2^m$ codewords of length m bits approximating $F_\zeta^{-1}$, and choosing that set of $2^n$ codewords with minimum mean or minimum Hamming distance between codewords.

An implementation of the nonlinearity for large values of n will now be described. The distribution as a function of "word size" i.e., the number of bits n in the expansion $$\sum_{r=1}^{n} b_r 2^{-r} = v$$

behaves "fractally" as n becomes large. This suggests then a way to implement the nonlinearity for large bit lengths. First, break up the "long" codewords into a series of short codewords. Second, use a smaller nonlinearity on each of the shorter code words.

An alternative method of generating this nonlinearity would be to use a polynomial fit to the original inverse distribution and to use that polynomial to compute the nonlinearity instead of a lookup table.

Since the codes described here for the $\{u_1, \ldots u_k\}$ are an isomorphism to the $\{u_1, \ldots u_k\}$, without noise the original Bernoulli($\frac{1}{2}$) sequence of the $\{u_1, \ldots u_k\}$ may be recovered from the Bernoulli($\delta$) sequence via a lookup table or via a sequence of iterations using a lookup table if the signal-to-noise ratio is high. Alternatively, when the signal to noise ratio is moderate or lower, log-likelihood ratio decoding to yield soft outputs for the $\{u_1, \ldots u_k\}$ may be performed. These soft outputs may then be used as inputs to a decoder to decode the underlying information that was coded into the $\{u_1, \ldots u_k\}$. Note also that the Bernoulli($\delta$) sequence may be composed of multiple Bernoulli($\delta$) subsequences.

In yet another alternative, if the code is received in noise, either syndrome decoding can be used to decode the (sub) sequences, or the Bernoulli($\delta$) code itself may be incorporated into a soft decision decoder such as a turbo-code decoder or Viterbi decoder to yield the underlying information that was coded into the $\{u_1, \ldots u_k\}$.

Figure 9:
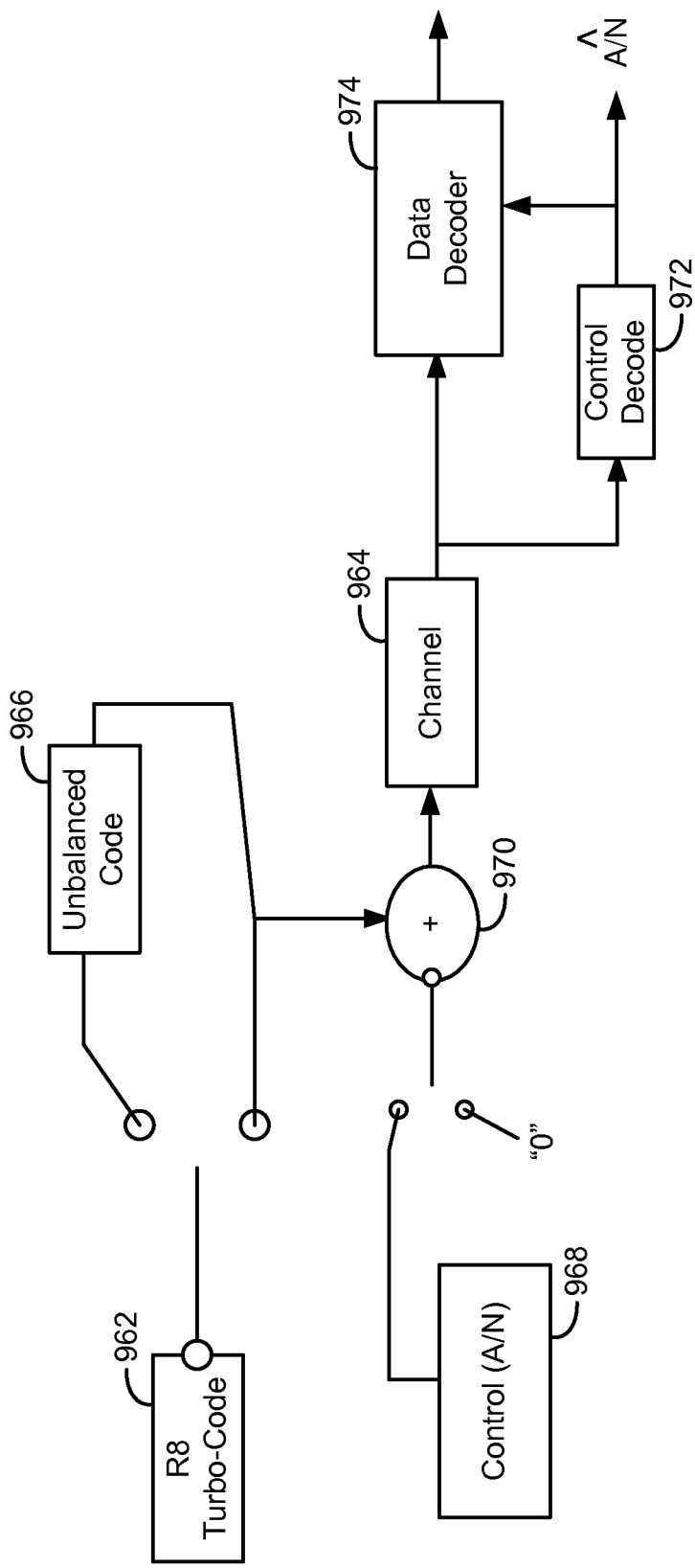
FIG. 9 is a block diagram that illustrates a scheme where embedded coding of control information is not applied over all coded data.

An example of the application of this scheme using a turbo-code 962 to encode information is illustrated in FIG. 9. A turbo-code 962 codes unencoded data producing the coded output sequence $\{u_1, \ldots u_k\}$. This sequence is input either directly to the channel 964 or, alternatively, the coded output is put through an Unbalanced Code 966 which models the nonlinearity as described above. This output is then modulo-2 added 970 to Control Information 968 which may be ACK or NAK. If the Unbalanced code 966 is not used, there is no modulo-2 addition to turbo-coded output of ACK or NAK bits. In particular, the Unbalanced Code 966 may be a rate 3/5 code with the characteristic as in the following table:

TABLE 1

Example of Unbalanced Code of rate 3/5

| Input bits | Output bits |
|---|---|
| 000 | 00111 |
| 001 | 01011 |
| 010 | 01101 |
| 011 | 10000 |
| 100 | 10101 |
| 101 | 10110 |
| 110 | 11001 |
| 110 | 11111 |

By utilizing the scheme described in this example, embedded coding of control information is not applied over all coded data, and the coded bits in which embedded coding of control information is not present may be used to help decode the areas in which embedded coding is present, thus minimizing the error rates of both coded data and embedded control data. The amount of embedding of control data may then be varied to trade off transmission reliability of coded data versus that of embedded control data.

At the receiver, the ACK/NAK control data signal may be detected from the noisy received bit stream by employing a log likelihood ratio based detection scheme on successive n bit groups (for the example here n=5), summing likelihoods and then thresholding (about zero):

$$\lambda_j(y) = \log\left(\frac{\sum_{all\ codewords\ x_k} \exp(y-x_k)^2/2\sigma^2}{\sum_{all\ codewords'\ complements\ x_k} \exp(y-x_k^c)^2/2\sigma^2}\right)$$

where $\lambda_j(y)$ represents the log likelihood on a n (=5) bit chunk of received data. After receiving J of these chunks of data a decision may be made by thresholding the sum of the log likelihoods:

$$\Lambda(y_1 \ldots y_J) = \sum_{j=1}^{J} \lambda_j(y_j),$$

and a NAK would be detected if, e.g., $\Lambda(y_1 \ldots y_J) > 0$, and an ACK would be detected otherwise.

A variation on the foregoing method of unequal error protection will now be described in relation to FIG. 6. For clarity, we take K=4, and v={a, b, c, d}, and specifically, for this example we assume that the message v=a is to be transmitted. Also, for simplicity let us assume that the first FEC encoder 640 encodes the sequence {$u_1, \ldots u_k$} 616 into a sequence {$\rho_1, \ldots, \rho_m$} 642, where each $\phi_i$ takes on values from {a, b, C, d}. In addition, we assume that m, n, >>K (which in this specific case is 4). As an example we could use the 1/3 rate turbo code from 3GPP TR 36.212.

In the following we will assume that Z is a discrete memoryless channel with stochastic matrix $W_Z$, although the methods discussed here are readily adapted to other types of channels. Furthermore we assume that Z is symmetric (although this may not be needed in all cases, it helps facilitate the solution to the problem). By symmetric we mean that the conditions in equations (11) and (12) are satisfied:

$$W(\zeta|\zeta) = 1 - \varepsilon \text{ for all } \zeta = \{a, b, c, d\} \quad (11)$$

$$W(\xi|\zeta) = \delta = \frac{\varepsilon}{K-1}, \xi \neq \zeta \quad (12)$$

Thus, W has the form $$W = \begin{bmatrix} 1-\epsilon & \frac{\epsilon}{K-1} & \cdots & \frac{\epsilon}{K-1} \\ \frac{\epsilon}{K-1} & 1-\epsilon & \cdots & \frac{\epsilon}{K-1} \\ & \ddots & \ddots & \\ \frac{\epsilon}{K-1} & \cdots & \frac{\epsilon}{K-1} & 1-\epsilon \end{bmatrix}.$$

Assuming the coder first FEC coder 640 is a "reasonably good code" (i.e., well suited to be used on a discrete memoryless channel), it should have the following properties:

First, it should have symbol distributions that are roughly the same, with asymptotically normally distributed numbers of symbols per codeword. That is, for our case the number of a's, for example, in a codeword should be roughly normally distributed, and should be roughly distributed the same way as the number of b's.

Second, it should have "many" codewords near equally weighted in the number of symbols per codeword.

Codes such as the aforementioned turbo-codes used for the Physical Uplink Shared Channel for 3GPP Release 8 have properties similar to this, and can thus be used as the basis for encoding an unequal error protection of messages to be embedded with data. Coders such as Low Density Parity Check Codes, Reed-Solomon Codes, convolutional codes and other codes may be used as well.

We will now describe a class of encoders for "FEC Coder #2" 644, their required properties, and decoding methods. Specifically we consider that FEC Coder #2 644 has the property that, depending on the message from {a, b, C, d} to be transmitted, to an agnostic observer it appears as though there were an asymmetric channel that biases its output symbols {$\rho_1, \ldots, \rho_m$} 642 towards a particular codeword distribution given a message to be transmitted. Thus, this agnostic observer, looking over a very large number of input sequences {$\rho_1, \ldots, \rho_m$} 642 into the coder 644 might observe the output sequences {$\psi_1, \ldots, \psi_m$} 648 have the property that would be expressed as a stochastic matrix which apparently biases outputs towards the symbol a. An example of such a matrix might be given as:

$$V_{v=a} = \begin{bmatrix} 1 & 0 & \cdots & 0 \\ \gamma & 1-\gamma-\frac{\theta}{K-2} & \cdots & \theta \\ & \ddots & \ddots & \\ \gamma & \cdots & \theta & 1-\gamma-\frac{\theta}{K-2} \end{bmatrix}$$

where $0 \leq \theta = \gamma < 1$. (The i-th row and j-th column entry of V represents the probability that an output symbol is the j-th letter of the alphabet given the input symbol is the i-th letter.)

In general for the system to work the "errors" introduced by the second message FEC encoding process are correctable with the code in a noiseless channel, and the for the noisy channel we would also require that the noise introduced by the channel be relatively small compared to the encoding process, or:

$$\gamma << \frac{\varepsilon}{K-1}. \quad (13)$$

$V_{v=b}$, $V_{v=c}$, and $V_{v=d}$ may be realized as permutations of $V_{v=a}$. For example:

$$V_{v=b} = \begin{bmatrix} \gamma & 1-\gamma-\frac{\theta}{K-2} & \cdots & \theta \\ 0 & 1 & \cdots & 0 \\ & \ddots & \ddots & \\ \gamma & \cdots & \theta & 1-\gamma-\frac{\theta}{K-2} \end{bmatrix}.$$

The second FEC encoder 644 may be referred to as the message coder. There are several possible methods for implementing the message coder. Three different methods will now be described.

Method 1: A "(pseudo)random code" may be designed for $\{v_k\}$, i.e., realizing the encoding as a "noisy channel" operating on $\{(\rho_1, \ldots, \rho_m)\}$ 642 based on a desired stochastic matrix V of the encoder given the symbol input $\{v_k\}$ (the ensemble of which we denote as $\{V_v\}$. The FEC Encoder #2 644 is in effect realized as an asymmetric channel operating on $\{\rho_1, \ldots, \rho_m\}$ 642. This may be thought of as being realized by, for each $\rho_k$, mapping into the output alphabet according to a pseudo-random number generator whose outputs are a set of discrete outcomes with probabilities chosen from the row of $V_v$ corresponding to the symbol value of $\rho_k$.

Method 2: "FEC Coder #2" 644 operates on the entire sequence of coded symbols $\{\rho_1, \ldots, \rho_m\}$ 642, and forces the empirical distribution (or equivalently stochastic matrix) of output symbols to be as determined by the matrices $\{V_v\}$. The exact mapping to do this may be any mapping that produces the required empirical distribution/empirical stochastic matrix. In particular, it may be any mapping that, based on the value of the $\{v_k\}$'s, minimizes the probability $\{\hat{u}_1, \ldots \hat{u}_n\} \neq \{u_1, \ldots u_n\}$.

Figure 7:
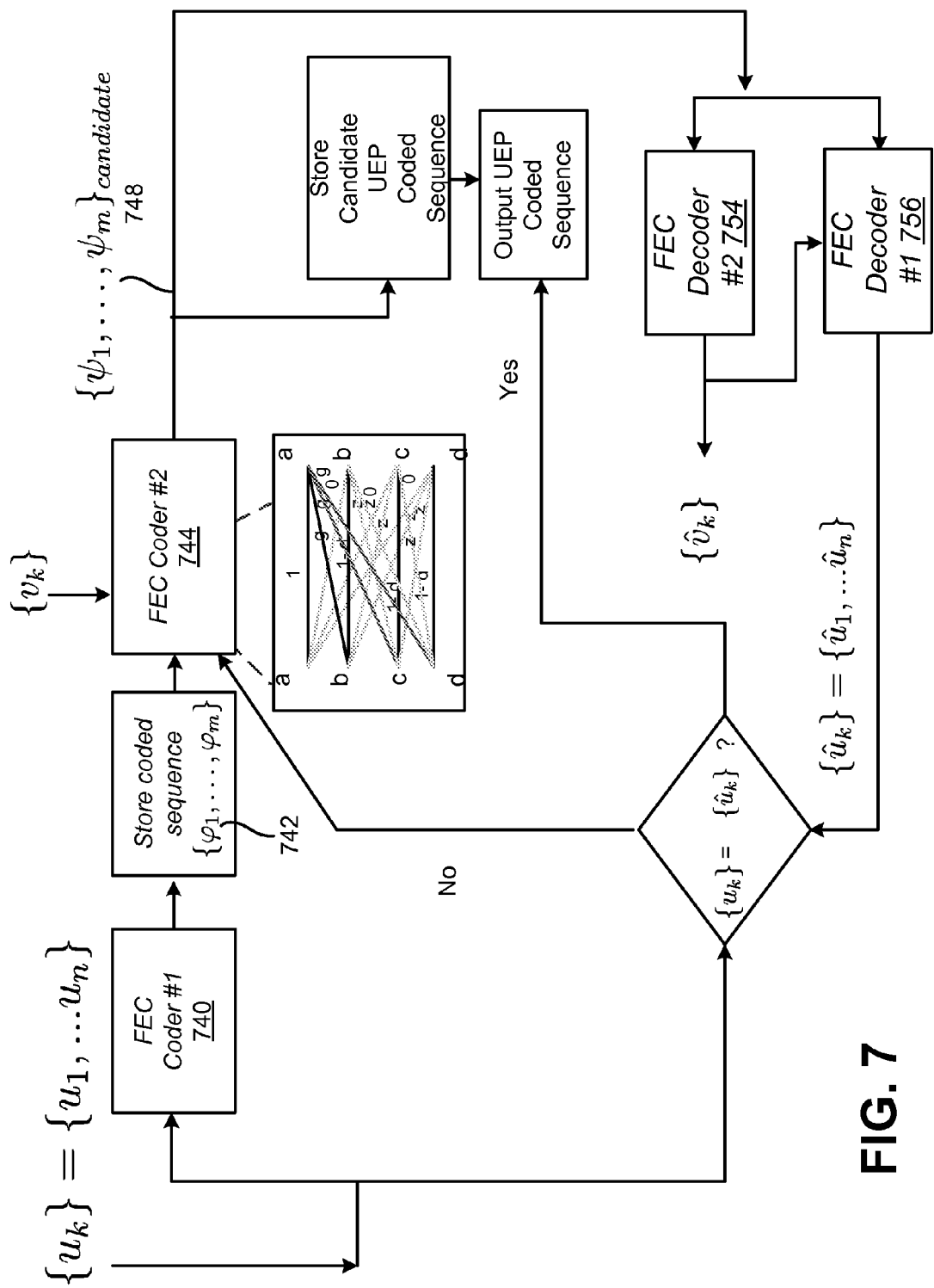
FIG. 7 illustrates an FEC unequal error protection coder realized with feedback.

Method 3-Feedback: Referring to FIG. 7, "FEC Coder #2" 744 may be realized with decoders and re-encoders to ensure error-free re-creation of $\{\hat{u}_k\}$ in a noiseless channel, as in FIG. 4. The FEC Coder #2 744 may be realized either as a (pseudo) random channel or as a "Method 2" encoder as mentioned above. A variation on this feedback mechanism replaces the decision mechanism and decoder for FEC Coder #1 740 with a Hamming distance computation between $\{\rho_1, \ldots, \rho_m\}$ 742 and $\{\psi_1, \ldots, \psi_m\}_{candidate}$ 748, and outputs the coded sequence $\{\psi_1, \ldots, \psi_m\}_{candidate}$ 748 with minimum Hamming distance corresponding to the encoding.

The following design constraints on the message encoder ("FEC Coder #2" 744) should be considered. Using the above notation in describing the entries of $\{V_v\}$ and Z, we have that $$\gamma << \frac{\varepsilon}{K-1}.$$

This imposes implicit constraints on the received signal-to-interference-and-noise-ratio (SINR).

In order to implement these coders, in general some degree of trial and error should be used. The stochastic matrix V might be found empirically, based on error requirements for $\{u_1, \ldots u_n\}$ and $\{v\}$. Also, the SINR constraints mentioned above should be affirmed via simulation. For 3GPP LTE, the coders can be implemented on a single sub-frame basis, and hybrid automatic repeat-request (HARQ) may be used to retrieve any errored portions of signals.

Decoding is generally done in two steps. First, the "message" encoded via FEC Coder #2 is decoded. This might be implemented by creating an empirical distribution function of received data symbols and to decide that the message $v_k$ was sent if the empirical distribution function is closest to that implied by the stochastic matrix $Vv_k$. Equivalently a likelihood ratio based decoder may be used.

The second decoding is to find $\{\hat{u}_k\} = \{\hat{u}_1, \ldots \hat{u}_n\}$, This could be done without any information supplied from the decoding of FEC Coder #2; on the other hand it may be decoded by using explicit information about the likelihood of symbols being "errored" by FEC Coder #2 based on the stochastic matrix corresponding to the decided $v_k$.

Figure 6:
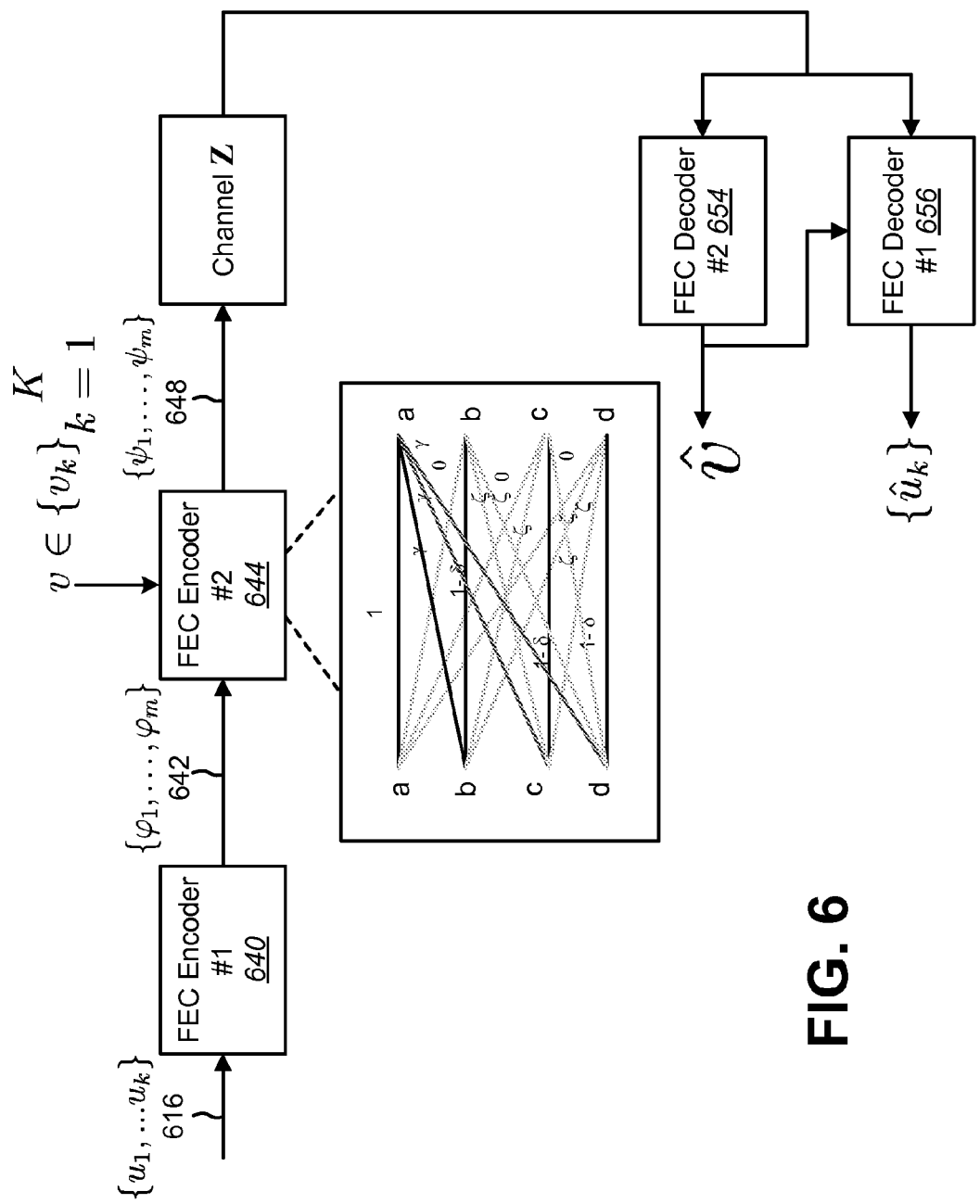
FIG. 6 is a block diagram illustrating another method for unequal error protection encoding.

The systems 600, 700 shown in FIGS. 6 and 7 include both an FEC Decoder #2 654, 754 and an FEC Decoder #1 656, 756 for implementing the decoding steps described above.

From the foregoing discussion, it may be seen that the present disclosure provides a method of encoding that uses standard codecs such as linear encoders and decoders for encoding and decoding data with different levels of robustness to errors. The present disclosure also provides a method of using subsets of coded outputs from standard codecs for encoding and decoding data with different levels of robustness to errors. Although the Bern($\delta$) encoder 320 and the DMC-like encoder 420 utilize non-linearities, the original Bern(½) coders are typically generated as linear coders. For example, turbo-codes are (time varing) linear codes, as are convolutional codes, BCH codes, Reed-Solomon codes, Reed-Muller codes and the like. So we can provide a linearly coded input (the $\{u_1, \ldots u_n\}$ mentioned above) as an input to the nonlinear code. In addition, the "Bern(½)" coder for the control information can also be done with standard codes, including but not limited to the codes currently used for this purpose in 3GPP, namely, Reed-Muller codes and convolutional codes.

In accordance with the present disclosure, multiple encoders may be used. One of the encoders may use a standard encoder (e.g., a turbo code, LDPC code, Reed-Solomon code or convolutional code), followed by a nonlinearity that creates an unequal distribution of ones and zeros in a binary representation of the code. For example, the Bern($\delta$) encoder 320 and DMC-like encoder 420 discussed above operate in this manner.

The nonlinearity may be created by an approximation to an inverse distribution function. An example of the inverse distribution function is $F_\xi^{-1}$. As discussed above, the distribution $F_\xi$ may be determined by Bernoulli($\delta$) codewords v of length m, where $F_\xi^{-1}$ is the inverse of $F_\xi$.

The nonlinearity may be successively applied to subsequences of codewords from the original code. For example, as discussed above, for large bit lengths the nonlinearity may be implemented by breaking up the "long" codewords into a series of short codewords, and using a smaller nonlinearity on each of the shorter code words.

The codewords in the nonlinearity may be chosen not only to be unequal, but also to optimize some measure of Hamming distance (e.g., average or minimum Hamming distance) between codewords. As discussed above, this can be done by choosing multiple sets of $2^n$ codewords pseudo-randomly according to a uniform distribution from the $2^m$ codewords of length m bits approximating $F_c^{311}$, and choosing that set of $2^n$ codewords with minimum mean or minimum Hamming distance between codewords.

As discussed above, the methods disclosed herein may be utilized to encode control data and user data, so that the encoded control data is more heavily protected than the encoded user data. Because the methods disclosed herein rely on probabilities, the present disclosure also describes the use of a probabilistic process to encode control data for forward error correction.

The encoding process of the control data may be modeled as encoding one of a discrete set of messages. The message set may be channel quality indicator (CQI) values. The user data may be uplink shared data in a 3GPP LTE system or a 3GPP LTE-like system.

The inputs for both the heavily protected and less heavily protected data may include downlink control information such as scheduling sent to different remote handsets/UEs. For example, a UE close to a base station may receive a stronger signal, and hence require less error protection than a further away UE. In such a case both $\{u_1, \ldots u_k\}$ and v would both be conveying control information.

The present disclosure also describes the use of a coder that represents message outputs as "channels" that create state transitions (or symbol errors) in a data forward error correction coder. For example, as discussed above, the FEC Coder #2 644 in FIG. 6 has the property that, depending on the message from $\{a, b, C, d\}$ to be transmitted, to an agnostic observer it appears as though there were an asymmetric channel that biases its output symbols $\{\rho_1, \ldots, \rho_m\}$ 642 towards a particular codeword distribution given a message to be transmitted. Thus, this agnostic observer, looking over a very large number of input sequences $\{\rho_1, \ldots, \rho_m\}$ 642 into the coder 644 might observe the output sequences $\{\psi_1, \ldots, \psi_m\}$ 648 have the property that would be expressed as a stochastic matrix which apparently biases outputs towards the symbol a.

The present disclosure also describes a method of code design for message encoding that maps a sequence of (previously coded) data into a chosen empirical distribution based on a desired stochastic matrix. This was discussed above in connection with the "Method 2" implementation of the FEC Coder #2 644. As discussed above, FEC Coder #2 644 operates on the entire sequence of coded symbols $\{\rho_1, \ldots, \rho_m\}$ 642, and forces the empirical distribution (or equivalently stochastic matrix) of output symbols to be as determined by the matrices $\{V_v\}$. As discussed above, any mapping may be used that, based on the value of the $\{v_k\}$'s, minimizes the probability $\{\hat{u}_1, \ldots \hat{u}_n\} \neq \{u_1 \ldots u_n\}$.

The present disclosure also describes the use of an adaptive method of message encoding that maps coded messages into a coded sequence of user data in such a way as to maintain error-free decoding of the encoding of data subject to maintaining a given empirical distribution (representing forward error correction encoded messages). This was discussed above in connection with the "Method 3" implementation of the FEC Coder #2 744, as illustrated in FIG. 7.

The present disclosure also describes the use of an adaptive method of message encoding that maps coded messages into a coded sequence of user data in such a way as to maintain error-free decoding of the encoding of data subject to maintaining a minimum Hamming weight between the coded user data and the message-embedded coded data. This was discussed above in connection with the "Method 3" implementation of the FEC Coder #2 744. As discussed above, the Hamming distance between $\{\rho_1, \ldots, \rho_m\}$ 742 and $\{\psi_1, \ldots, \psi_m\}_{candidate}$ 748 may be computed, and the coded sequence $\{\psi_1, \ldots, \psi_m\}_{candidate}$ 748 with minimum Hamming distance corresponding to the encoding may be output.

Figure 8:
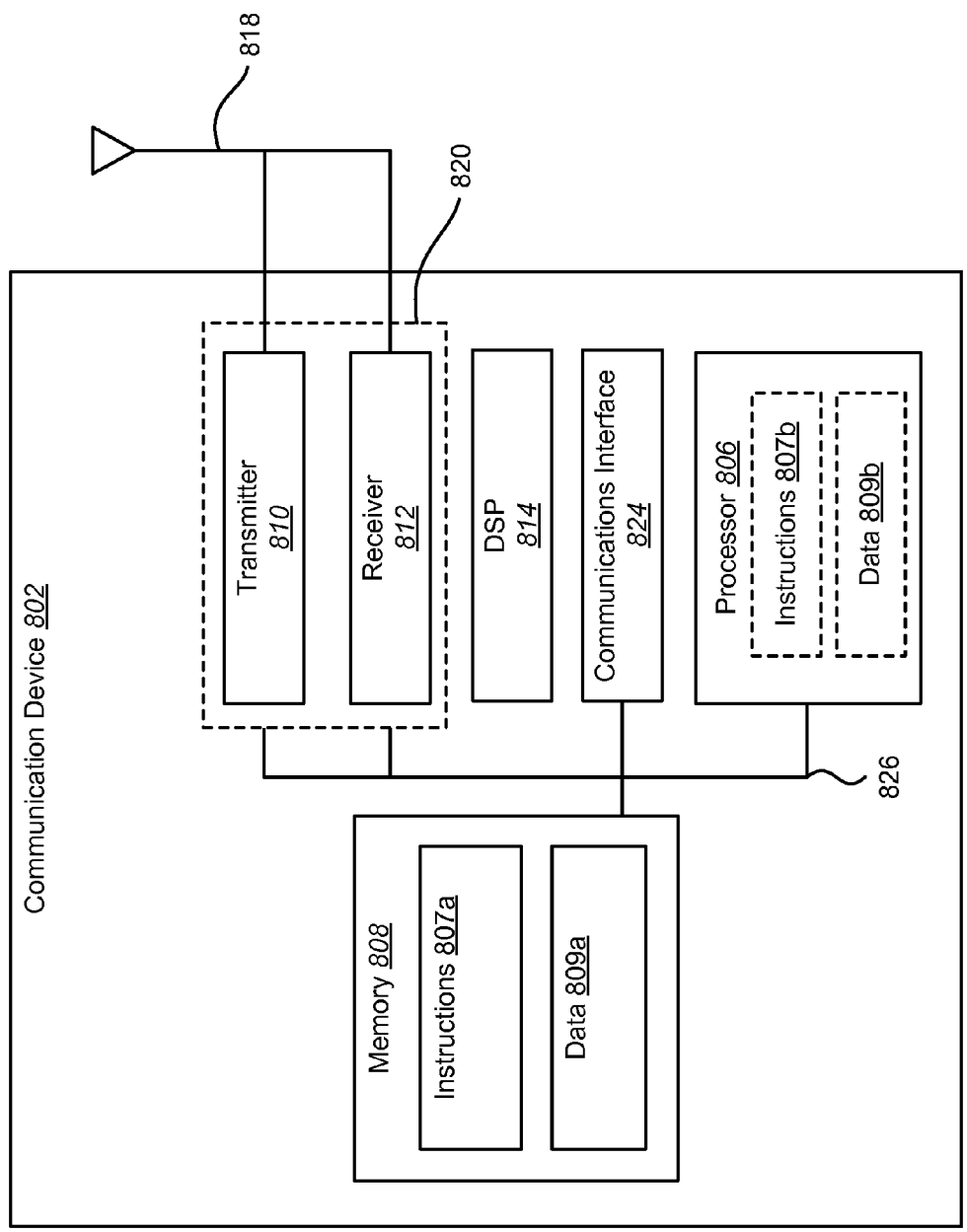
FIG. 8 illustrates various components that may be utilized in a communications device.

FIG. 8 illustrates various components that may be utilized in a communications device 802. The communications device 802 may include any type of communications device such as a mobile station, a cell phone, an access terminal, user equipment, a base station transceiver, a base station controller, etc. The communications device 802 includes a processor 806 that controls operation of the communications device 802. The processor 806 may also be referred to as a CPU. Memory 808, which may include both read-only memory (ROM), random access memory (RAM) or any type of device that may store information, provides instructions 807a and data 809a to the processor 806. A portion of the memory 808 may also include non-volatile random access memory (NVRAM). Alternatively, or in addition to, instructions 807b and data 809b may reside in the processor 806. Instructions 807b loaded into the processor 806 may also include instructions 807a from memory 808 that were loaded for execution by the processor 806.

The communications device 802 may also include a housing that contains a transmitter 810 and a receiver 812 to allow transmission and reception of data. The transmitter 810 and receiver 812 may be combined into a transceiver 820. An antenna 818 is attached to the housing and electrically coupled to the transceiver 820. Additional antennas (not shown) may also be used.

The various components of the communications device 802 are coupled together by a bus system 826 which may include a power bus, a control signal bus, and a status signal bus in addition to a data bus. However, for the sake of clarity, the various buses are illustrated in FIG. 8 as the bus system 826. The communications device 802 may also include a digital signal processor (DSP) 814 for use in processing signals. The communications device 802 may also include a communications interface 824 that provides user access to the functions of the communications device 802. The communications device 802 illustrated in FIG. 8 is a functional block diagram rather than a listing of specific components.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory may be integral to a processor and still be said to be in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for embedded unequal error protection encoding, comprising:
encoding first data, wherein a code that is used to encode the first data comprises a standard code followed by a nonlinearity that creates an unequal distribution of ones and zeros in a binary representation of the code, wherein codewords in the nonlinearity are chosen to be unequal and are also chosen to maximize an average Hamming distance between the codewords;
encoding second data, wherein linear encoders are used to encode the first data and to encode the second data, and wherein the first data and the second data are encoded by the linear encoders so as to provide different levels of robustness to errors; and
sending a signal that comprises the encoded first data and the encoded second data over a channel to a receiver.

2. The method of claim 1, wherein the standard code is selected from the group consisting of a turbo code, a low density parity check (LDPC) code, a Reed-Solomon code, and a convolutional code.

3. The method of claim 1, wherein a code that is used to encode the first data comprises a standard code in which a fraction of the coded data is followed by a nonlinearity that creates an unequal distribution of ones and zeros in a binary representation of the code, and wherein the standard code is selected from the group consisting of a turbo code, a low density parity check (LDPC) code, a Reed-Solomon code, and a convolutional code.

4. The method of claim 1, wherein a code that is used to encode the first data comprises a standard code followed by a code whose set of codewords does not contain any codewords' complements, and wherein the standard code is selected from the group consisting of a turbo code, a low density parity check (LDPC) code, Reed-Solomon code, and a convolutional code.

5. The method of claim 1, wherein the nonlinearity is created by an approximation to an inverse distribution function.

6. The method of claim 1, wherein the nonlinearity is successively applied to subsequences of codewords from the standard code.

7. The method of claim 1, wherein the second data is control data for forward error correction, and wherein a probabilistic process is used to encode the control data.

8. The method of claim 1, wherein encoding the second data comprises representing message outputs as channels that create state transitions or symbol errors in a data forward error correction coder.

9. The method of claim 1, wherein encoding the second data comprises mapping a sequence of previously coded data into a chosen empirical distribution based on a desired stochastic matrix.

10. The method of claim 1, wherein the first data comprises user data, wherein the second data comprises messages, and further comprising mapping coded messages into a coded sequence of user data in such a way as to maintain error-free decoding of the encoding of data subject to maintaining a given empirical distribution representing forward error correction encoded messages.

11. The method of claim 1, wherein the first data comprises user data, wherein the second data comprises messages, and further comprising mapping coded messages into a coded sequence of user data in such a way as to maintain error-free decoding of the encoding of data subject to maintaining a minimum Hamming weight between the coded user data and the message-embedded coded data.

12. The method of claim 1, wherein the second data comprises messages, and wherein the messages to be encoded are channel quality indicator (CQI) values.

13. The method of claim 1, wherein the second data comprises messages, and wherein the messages to be encoded comprise at least one of an acknowledgement (ACK) message and a negative acknowledgement (NACK) message.

14. The method of claim 1, wherein the first data comprises user data, and wherein the user data is uplink shared data in a 3GPP Long Term Evolution (LTE) system or a 3GPP LTE-like system.

15. The method of claim 1, wherein the second data is heavily protected data, wherein the first data is less heavily protected data, and wherein inputs for both the heavily protected data and the less heavily protected data comprise downlink control information.

16. A method for embedded unequal error protection decoding, comprising:
  receiving a signal that comprises encoded first data and encoded second data, wherein the first data and the second data are encoded by linear encoders so as to provide different levels of robustness to errors, wherein a code that is used to encode the first data comprises a standard code followed by a nonlinearity that creates an unequal distribution of ones and zeros in a binary representation of the code, wherein codewords in the nonlinearity are chosen to be unequal and are also chosen to maximize an average Hamming distance between the codewords;
  decoding the first data; and
  decoding the second data, wherein linear decoders are used to decode the first data and to decode the second data.

17. A wireless communication device that is configured to implement embedded unequal error protection encoding, comprising:
  a processor;
  memory in electronic communication with the processor; and
  instructions stored in the memory, the instructions being executable by the processor to:
    encode first data, wherein a code that is used to encode the first data comprises a standard code followed by a nonlinearity that creates an unequal distribution of ones and zeros in a binary representation of the code, wherein codewords in the nonlinearity are chosen to be unequal and are also chosen to maximize an average Hamming distance between the codewords;
    encode second data, wherein linear encoders are used to encode the first data and to encode the second data, and wherein the first data and the second data are encoded by the linear encoders so as to provide different levels of robustness to errors; and
    send a signal that comprises the encoded first data and the encoded second data over a channel to a receiver.

18. The wireless communication device of claim 17, wherein the standard code is selected from the group consisting of a turbo code, low density parity check (LDPC) code, Reed-Solomon code, and a convolutional code.

19. The wireless communication device of claim 17, wherein a code that is used to encode the first data comprises a standard code in which a fraction of the coded data is followed by a nonlinearity that creates an unequal distribution of ones and zeros in a binary representation of the code, and wherein the standard code is selected from the group consisting of a turbo code, a low density parity check (LDPC) code, Reed-Solomon code, and a convolutional code.

20. The wireless communication device of claim 17, wherein a code that is used to encode the first data comprises a standard code followed by a code whose set of codewords does not contain any codewords' complements, and wherein the standard code is selected from the group consisting of a turbo code, a low density parity check (LDPC) code, a Reed-Solomon code, and a convolutional code.

21. The wireless communication device of claim 17, wherein the nonlinearity is created by an approximation to an inverse distribution function.

22. The wireless communication device of claim 17, wherein the nonlinearity is successively applied to subsequences of codewords from the standard code.

23. The wireless communication device of claim 17, wherein the second data is control data for forward error correction, and wherein a probabilistic process is used to encode the control data.

24. The wireless communication device of claim 17, wherein encoding the second data comprises representing message outputs as channels that create state transitions or symbol errors in a data forward error correction coder.

25. The wireless communication device of claim 17, wherein encoding the second data comprises mapping a sequence of previously coded data into a chosen empirical distribution based on a desired stochastic matrix.

26. The wireless communication device of claim 17, wherein the first data comprises user data, wherein the second data comprises messages, and further comprising mapping coded messages into a coded sequence of user data in such a way as to maintain error-free decoding of the encoding of data subject to maintaining a given empirical distribution representing forward error correction encoded messages.

27. The wireless communication device of claim 17, wherein the first data comprises user data, wherein the second data comprises messages, and further comprising mapping coded messages into a coded sequence of user data in such a way as to maintain error-free decoding of the encoding of data subject to maintaining a minimum Hamming weight between the coded user data and the message-embedded coded data.

28. The wireless communication device of claim 17, wherein the second data comprises messages, and wherein the messages to be encoded are channel quality indicator (CQI) values.

29. The wireless communication device of claim 17, wherein the first data comprises user data, and wherein the user data is uplink shared data in a 3GPP Long Term Evolution (LTE) system or a 3GPP LTE-like system.

30. The wireless communication device of claim 17, wherein the second data is heavily protected data, wherein the first data is less heavily protected data, and wherein inputs for both the heavily protected data and the less heavily protected data comprise downlink control information.

31. A wireless communication device that is configured to implement embedded unequal error protection decoding, comprising:
  a processor;
  memory in electronic communication with the processor; and
  instructions stored in the memory, the instructions being executable by the processor to:
    receive a signal that comprises encoded first data and encoded second data, wherein the first data and the second data are encoded by linear encoders so as to provide different levels of robustness to errors, wherein a code that is used to encode the first data comprises a standard code followed by a nonlinearity that creates an unequal distribution of ones and zeros in a binary representation of the code, wherein codewords in the nonlinearity are chosen to be unequal and are also chosen to maximize an average Hamming distance between the codewords;
    decode the first data; and decode the second data, wherein linear decoders are used to decode the first data and to decode the second data.

* * * * *

UNITED STATES PATENT AND TRADEMARK OFFICE
CERTIFICATE OF CORRECTION

PATENT NO.         : 8,806,288 B2                                    Page 1 of 1
APPLICATION NO.    : 12/404264
DATED              : August 12, 2014
INVENTOR(S)        : John Michael Kowalski et al.

It is certified that error appears in the above-identified patent and that said Letters Patent is hereby corrected as shown below:

In the Specification

In column 1, lines 8-9, please delete "wireless communications wireless" and replace it with --wireless communications and wireless--.
In column 4, line 57, please delete "channel F" and replace it with --channel Γ--.
In column 7, line 61, please delete "actual 8" and replace it with --actual δ--.
In column 9, line 60, please delete "C" and replace it with --c--.
In column 10, line 42, please delete "C" and replace it with --c--.

Signed and Sealed this
Twenty-fourth Day of February, 2015

Michelle K. Lee
*Deputy Director of the United States Patent and Trademark Office*